United States Patent
Li et al.

(10) Patent No.: US 9,385,701 B2
(45) Date of Patent: Jul. 5, 2016

(54) METHOD AND DEVICE FOR GENERATING PWM PULSES FOR MULTI-LEVEL INVERTER

(71) Applicant: Sungrow Power Supply Co., Ltd., Hefei, Anhui (CN)

(72) Inventors: Xiaoxun Li, Anhui (CN); Haoyuan Li, Anhui (CN); Xiaodong Mei, Anhui (CN); Zhiqiang Han, Anhui (CN); Benhe Yang, Anhui (CN); Kai Shen, Anhui (CN)

(73) Assignee: SUNGROW POWER SUPPLY CO., LTD. (CN)

(*) Notice: Subject to any disclaimer, the term of this patent is extended or adjusted under 35 U.S.C. 154(b) by 0 days.

(21) Appl. No.: 14/883,967

(22) Filed: Oct. 15, 2015

(65) Prior Publication Data
US 2016/0118972 A1 Apr. 28, 2016

(30) Foreign Application Priority Data
Oct. 23, 2014 (CN) .......................... 2014 1 0570938

(51) Int. Cl.
  *H03K 3/00* (2006.01)
  *H03K 7/08* (2006.01)
  *H02M 7/5395* (2006.01)

(52) U.S. Cl.
  CPC .............. *H03K 7/08* (2013.01); *H02M 7/5395* (2013.01)

(58) Field of Classification Search
  CPC ............................... H03K 5/1565; H03K 7/08
  USPC ......... 327/291–299, 170–176, 108–112, 427, 327/434, 437; 326/82, 83
  See application file for complete search history.

(56) References Cited

U.S. PATENT DOCUMENTS 6,552,625 B2 * 4/2003 Bowling ................. H02P 27/08
                                                   327/172
6,803,796 B2 * 10/2004 Huang ................. H03L 7/0814
                                                   327/298

(Continued)

FOREIGN PATENT DOCUMENTS

EP          2140544 A1    1/2010

OTHER PUBLICATIONS

Extended European search report corresponding to Application No. 15189852.5-1809/3012960; Issued: Apr. 29, 2016.

(Continued)

*Primary Examiner* — Lincoln Donovan
*Assistant Examiner* — Thomas Skibinski
(74) *Attorney, Agent, or Firm* — Cantor Colburn LLP (57) ABSTRACT

A method and a device for generating PWM pulses for an inverter are provided. The three-phase inverter's characteristic of including high frequency complementary switches is used. Only three PWM peripheral units of a DSP control unit are used to output PWM high frequency signals, and a detection control unit determine for each phase two currently high frequency complementary switches according to the states of detected level signals outputted by a preset number of GPIO interfaces. The PWM high frequency signals are distributed for each phase to one of the two switches, and the PWM high frequency signals are inversed and then sent to the other one of the two switches. In addition, the states of other switches are maintained unchanged according to a preset correspondence between states of switches of a multi-level inverter and outputted level signals in different switching periods.

10 Claims, 4 Drawing Sheets

(56) References Cited

U.S. PATENT DOCUMENTS

| | | | | |
|---|---|---|---|---|
| 7,595,677 B2 * | 9/2009 | Haralabidis | ............ | H03K 5/156 327/116 |
| 8,232,820 B2 * | 7/2012 | Wang | ................. | G01R 31/3172 326/30 |
| 2002/0184469 A1 * | 12/2002 | Bowling | ................. | H02M 1/38 712/1 |
| 2014/0266362 A1 * | 9/2014 | Lee | ...................... | H03K 5/1565 327/175 |
| 2016/0043709 A1 * | 2/2016 | Lindahl | ............... | H04L 25/4902 327/175 |

OTHER PUBLICATIONS

Steffen Rohner et al: "Pulse width modulation scheme for the Modular Multilevel Converter"; 10 pages.

* cited by examiner

METHOD AND DEVICE FOR GENERATING PWM PULSES FOR MULTI-LEVEL INVERTER

CROSS-REFERENCE TO RELATED APPLICATION

This application claims priority under 35 U.S.C. §119 to Chinese Patent Application No. 201410570938.7, filed on Oct. 23, 2014, the entirety of which is incorporated by reference herein.

FIELD

The present disclosure relates to the technical field of pulse width modulation, and in particular to a method and device for generating PWM pulses for a multi-level inverter.

BACKGROUND

In recent years, with the rapid development of new energies and distributed power generation technologies, multi-level inverters, particularly three-level inverters and five-level inverters, have been widely used. In practice, the control of a multi-level inverter is usually realized through a pulse-width modulation (PWM) technology, where the required number of PWM pulse outputs increases with the increasing number of levels of the inverter and so does the complexity of the corresponding method of generating PWM pulses.

In the conventional art, PWM peripheral units of a C2000 Series DSP (Digital Signal Processing) chip are used for the determination of increase or decrease of the triangular carrier wave and the control of the duty ratio, to output corresponding PWM pulse signals. The PWM peripheral units of the DSP chip in this series have 12 PWM outputs in total.

For a three-phase three-level inverter with 12 switches, in a case that all the PWM peripheral units of the DSP chip are used, it can output PWM pulses required by the three-phase three-level inverter, but the number of levels of the inverter can not be increased. For an inverter with more levels, such as a three-phase five-level inverter with 24 switches, the DSP chip in this series can not output sufficient PWM pulses for the three-phase five-level inverter.

Therefore, for an multi-level inverter that has a wide application at present, it is an urgent problem to be solved that how to ensure both the reliable output of PWM pulses and the effective saving of PWM peripheral units of a DSP chip to reduce the difficulty in increasing the number of levels of the inverter.

SUMMARY

In view of this, it is to provide a method and a device for generating PWM pulses for a multi-level inverter to solve the problem in the conventional art such as shortage of DSP peripheral units configured to output PWM pulses for the multi-level inverter.

For achieving the above goal, the present disclosure provides the technical solutions as follows.

A method for generating PWM pulses for a multi-level inverter is provided, where the method is applied to a device for generating the PWM pulses for the inverter, where the device includes a DSP control unit and a detection control unit connected thereto, and where the method includes:

outputting PWM high frequency signals by three PWM peripheral units of the DSP control unit;

sending the PWM high frequency signals to the detection control unit;

detecting level signals outputted by a preset number of GPIO interfaces of the DSP control unit, by the detection control unit;

determining, for each phase, two high frequency complementary switches of the inverter, according to state of the level signals;

sending, for each phase, the PWM high frequency signal outputted by one of the PWM peripheral units to a first switch of the two switches;

inversing, for each phase, the PWM high frequency signal outputted by the one of the PWM peripheral units;

sending, for each phase, the inversed PWM high frequency signal to a second switch of the two switches; and maintaining, for each phase, state of other switches of the inverter except the two switches unchanged in a power frequency period, wherein the state of the other switches are determined according to a correspondence stored for each phase between the level signals outputted by the GPIO interfaces and the states of the switches.

Preferably, in a case that the inverter is a three-phase three-level inverter, the preset number are three, and the three GPIO interfaces corresponds to the three phases of the inverter respectively, where, determining two high frequency complementary switches as switches to be treated for one of multiple phases according to state of the level signals comprises:

determining two high frequency complementary switches as the switches to be treated for the phase, according to the state of the level signal outputted by one of the GPIO interfaces corresponding to the phase.

Preferably, in a case that the inverter is a three-phase four-level inverter or a three-phase five-level inverter, the preset number is six, wherein, determining two high frequency complementary switches as switches to be treated for one of multiple phases according to state of the level signals comprises:

determining two high frequency complementary switches as switches to be treated for the phase, according to the states of the level signals outputted by two of the GPIO interfaces corresponding to the phase.

Preferably, the states of the level signals outputted by the GPIO interfaces are determined according to a correspondence between PWM high frequency signals and triangular carrier signals.

Preferably, a power frequency period comprises multiple switching periods, and the state of the two of the switches to be treated are changed once for each of the switching periods, wherein, after sending the inversed PWM high frequency signal to a second switch of the switches to be treated, the method further comprises:

sending the PWM high frequency signal to a second switch of the switches to be treated after one of the switching periods; and sending the inversed PWM high frequency signal to the first switch of the switches to be treated.

A device for generating PWM pulses for a multi-level inverter is provided, where the device includes:

a DSP control unit and a detection control unit, wherein the DSP control unit comprises multiple PWM peripheral units and multiple GPIO interfaces, and the detection control unit is connected to the multiple GPIO interfaces, and wherein only three of the multiple PWM peripheral units of the DSP control unit are used to output PWM high frequency signals which are sent to the detection control unit;

the detection control unit detects level signals outputted by a preset number of GPIO interfaces of the multiple GPIO interfaces, determines, for each phase, two high frequency complementary switches of the inverter according to state of the level signals, sends, for each phase, the PWM high frequency signal outputted by one of the PWM peripheral units to a first switch of the two switches, inverses, for each phase, the PWM high frequency signal and then sends, for each phase, it to a second switch of the two switches, and maintains, for each phase, state of other switches of the inverter except the two switches unchanged in a power frequency period; and the state of the other switches are determined according to a correspondence stored for each phase between the level signals outputted by the GPIO interfaces and the states of the switches.

Preferably, the detection control unit is a CPLD (Complex Programmable Logic Device) control unit.

Preferably, the detection control unit is a FPGA (Field Programmable Gate Array) control unit.

Preferably, in a case that the inverter is a three-phase three-level inverter, the preset number are three, and the three GPIO interfaces corresponds to the three phases of the inverter respectively.

Preferably, in a case that the inverter is a three-phase four-level inverter or a three-phase five-level inverter, the preset number are six, and each of the three phases of the inverter corresponds to every two of the GPIO interfaces.

It can be seen that, compared with the conventional art, the present disclosure provides a method and a device for generating PWM pulses for an inverter. The present disclosure utilizes a three-phase multi-level inverter's characteristic of including high frequency complementary switches. The present disclosure only uses three PWM peripheral units of a DSP control unit to output PWM high frequency signals, and sends the signals to a detection control unit. Then the detection control unit determines for each phase two high frequency complementary switches according to the states of the detected level signals outputted by a preset number of GPIO (General Purpose Input Output) interfaces. In this case, the detection control unit only needs to distribute for each phase the received PWM high frequency signals to one of the two switches (i.e., a first switch), then inverses the PWM high frequency signal and sends the inversed signal to the other one of the two switches (i.e., a second switch), and maintains the states of other switches except the two switches for each phase unchanged according to a preset correspondence between states of switches of a multi-level inverter and levels outputted in different switching periods. Therefore, whatever the number of levels of a three-phase inverter is, the present disclosure uses only three PWM peripheral units of a DSP control unit. Compared with the conventional art, the present disclosure greatly saves the number of DSP peripheral units configured to output PWM pulses for a multi-level inverter, i.e., solves the problem of shortage of DSP peripheral units configured to output PWM pulses for a multi-level inverter in the conventional art and significantly reduces the difficulty in increasing the number of levels of the inverter.

BRIEF DESCRIPTION OF THE DRAWINGS

For a clear illustration of embodiments of the present disclosure or of technical solutions in the conventional art, figures used in the embodiments or in the description of the conventional art are briefly described as follows. Apparently, the figures in the following description are only embodiments of the present disclosure, other figures can be obtained according to the provided figures by those ordinarily skilled in the art without involving any creative efforts.

DETAILED DESCRIPTION OF THE EMBODIMENTS

The technical solutions according to embodiments of the present disclosure are clearly and completely described hereinafter in conjunction with figures. Apparently, the described embodiments are only a part rather than all of the embodiments according to the present disclosure. All other embodiments obtained according to the present disclosure by those ordinarily skilled in the art without involving any creative efforts will fall within the protection scope of the claims of the present disclosure.

In a case that PWM peripheral units of a C2000 Series DSP chip available form Texas Instruments alone are used for the determination of increase or decrease of the triangular carrier wave and the control of the duty ratio to output corresponding PWM pulses, all the PWM peripheral units of the DSP chip are needed to be used in order to output PWM pulses (i.e., PWM high frequency signals) for a three-level inverter. However, the number of levels of the inverter can not be increased. In addition, because a three-phase five-level inverter includes 24 switches, PWM peripheral units of the DSP chip in this series can not output PWM pulses to meet the requirement. Therefore, the DSP chip in this series can not output PWM pulses for an inverter with the number of levels being lager than three.

For solving the problem, the present disclosure provides a method and a device for generating PWM pulses for an inverter. The present disclosure utilizes a three-phase multi-level inverter's characteristic of including high frequency complementary switches. The present disclosure only uses three PWM peripheral units of a DSP control unit to output PWM high frequency signals, and sends the signals to a detection control unit. Then the detection control unit determines for each phase two high frequency complementary switches according to the states of the detected level signals outputted by a preset number of GPIO (General Purpose Input Output) interfaces. In this case, the detection control unit only needs to distribute for each phase the received PWM high frequency signals to one of the two switches (i.e., a first switch), then inverses the PWM high frequency signal and sends the inversed signal to the other one of the two switches (i.e. a second switch), and maintains the states of other switches unchanged according to a preset correspondence between states of switches and level signals outputted by GPIO interfaces for each phase. Therefore, whatever the number of levels of a three-phase inverter is, the present disclosure uses only three PWM peripheral units of a DSP control unit. Compared with the conventional art, the present disclosure greatly saves the number of DSP peripheral units configured to output PWM pulses for a multi-level inverter, i.e., solves the problem of shortage of DSP peripheral units configured to output PWM pulses for a multi-level inverter in the conventional art, and significantly reduces the difficulty in increasing the number of levels of the inverter.

In a case that the inverter is a three-phase three-level inverter, the method and device of generating PWM pulses for a multi-level inverter provided by the present disclosure are applicable to any three-level topologies for the inverter, such as a T-type three-level topology and an I-type three-level topology. The present disclosure only uses a T-type three-level inverter as an example for illustration, and the method of generating PWM pulses for three-level inverters with other topologies are similar to that of the former, which will not be described in detail herein by the present disclosure.

Figure 1:
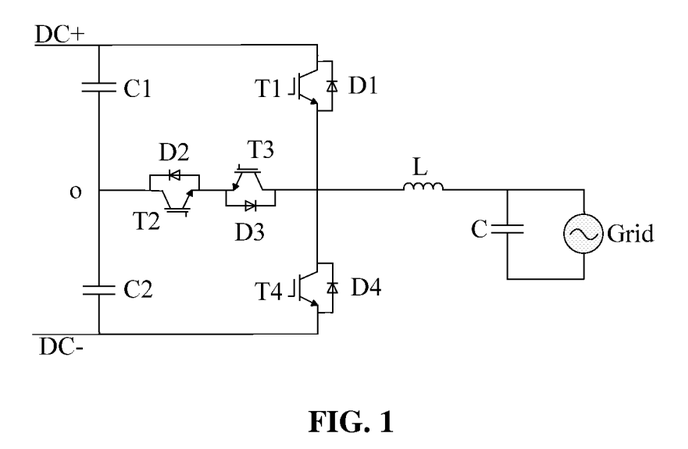
FIG. 1 is a schematic view of a single-phase topology of a T-type three-level inverter.

Reference is made to FIG. 1, which illustrates a schematic view of a single-phase topology of a T-type three-level inverter in the conventional art. The main circuit of the three-level inverter according to the embodiment mainly includes: two direct-current voltage-dividing capacitors, i.e., a first capacitor C1 and a second capacitor C2; two outside master power switches, i.e., a first master power switch T1 and a fourth master power switch T4, and two inside master power switches, i.e., a second master power switch T2 and a third master power switch T3; four freewheeling diodes, i.e., a first diode D1, a second diode D2, a third diode D3, and a fourth diode D4; and a LC filter.

It should be noted that, the connections and functions of elements of the above single-phase main circuit of the three-phase three-level inverter are common knowledge in the art, and will not be described in detail herein by the present disclosure.

It can be seen from the schematic view of the single-phase topology of the T-type three-level inverter as shown in FIG. 1, that the three-phase three-level inverter includes 12 switches, and the outputted levels have three level states: Level 1, Level 0 and Level −1. In a case that the neutral point "o" on the direct current side is used as a reference point, the voltage of Level 1 is $U_{dc}/2$ and the voltage of Level −1 is $-U_{dc}/2$. If 1 represents a switch being in the on-state and 0 represents a switch being in the off-state, then in a case of a single-phase three-level inverter, the correspondence between three outputted levels and states of switches is listed as follows.

TABLE 1

The three-level inverter's correspondence between states of switches and outputted levels

| outputted level | T1 | T2 | T3 | T4 |
|---|---|---|---|---|
| Level 1 | 1 | 1 | 0 | 0 |
| Level 0 | 0 | 1 | 1 | 0 |
| Level −1 | 0 | 0 | 1 | 1 |

In a case that a PWM high frequency signal outputted by the inverter is between Level 1 and Level 0, only T1 and T3 operate at a high frequency and are high frequency complementary, whereas T2 and T4 maintain in an unchanged state. In a case that the PWM high frequency signal is between Level −1 and Level 0, only T2 and T4 operate at a high frequency and are high frequency complementary, whereas T1 and T3 maintain in an unchanged state. It can be seen that, in each of switching periods, there is only one pair of complementary switches outputting a PWM high frequency signal for each bridge arm of the three-level inverter regardless of the state of the arm, and other switches maintain in an unchanged state.

Figure 2:
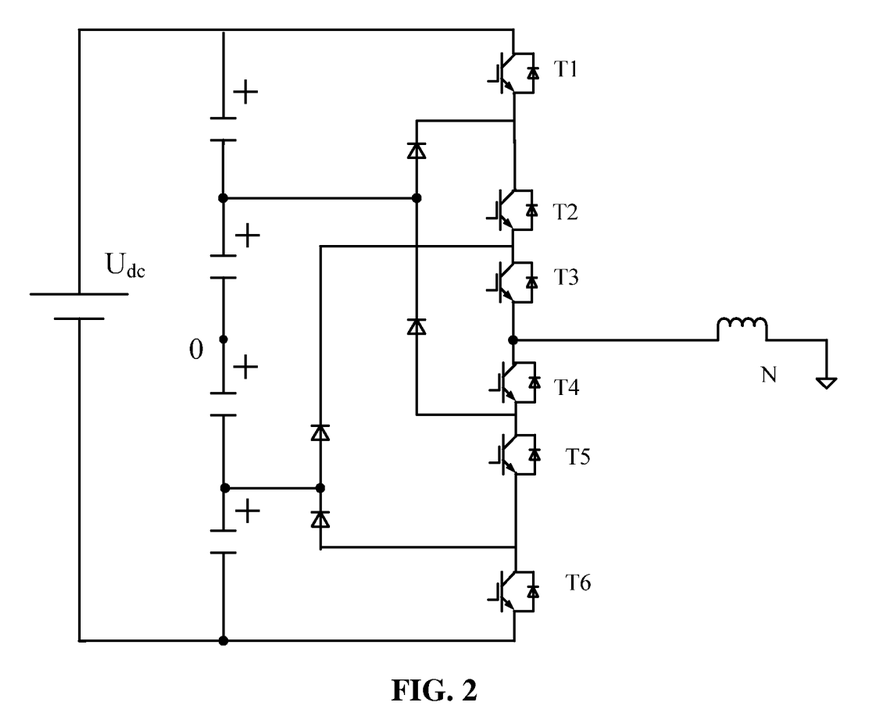
FIG. 2 is a view of a single-phase topology of a diode-clamped four-level inverter.

Similarly, in a case that the inverter is a three-phase four-level inverter, a view of a single-phase topology of a diode-clamped four-level inverter according to an example is shown in FIG. 2. In this case, the topology is common knowledge in the art, its components and connections will not be described in detail herein by the present disclosure.

It can be seen from FIG. 2 that the single-phase four-level inverter includes 6 switches T1 to T6, therefore, the three-phase four-level inverter includes 18 switches in total and its outputted levels have four states: Level 2, Level 1, Level −1 and Level −2. In a case that the neutral point "o" on the direct current side is also used as a reference point, the voltages of Level 2, Level 1, Level −1 and Level −2 are $U_{dc}/2$, $U_{dc}/6$, $-U_{dc}/6$ and $-U_{dc}/2$, respectively, where the correspondence between four outputted levels and states of switches is listed as follows.

TABLE 2

The four-level inverter's correspondence between states of switches and outputted levels

| outputted level | T1 | T2 | T3 | T4 | T5 | T6 |
|---|---|---|---|---|---|---|
| Level 2 | 1 | 1 | 1 | 0 | 0 | 0 |
| Level 1 | 0 | 1 | 1 | 1 | 0 | 0 |
| Level −1 | 0 | 0 | 1 | 1 | 1 | 0 |
| Level −2 | 0 | 0 | 0 | 1 | 1 | 1 |

It can be seen from Table 2 that, in a case that a PWM high frequency signal outputted by the inverter is between Level 2 and Level 1, only T1 and T4 operate at a high frequency and are high frequency complementary, whereas other switches maintain in an unchanged state. In a case that the PWM high frequency signal is between Level 1 and Level −1, only T2 and T5 operate at a high frequency and are high frequency complementary, whereas other switches maintain in an unchanged state. In a case that the PWM high frequency signal is between Level −1 and Level −2, only T3 and T6 operate at a high frequency and are high frequency complementary, whereas other switches maintain in an unchanged state. It can be seen that, in each of switching periods, there is only one pair of complementary switches outputting a PWM high frequency signal for each bridge arm of the four-level inverter regardless of the state of the arm, and other switches maintain in an unchanged state.

Figure 3:
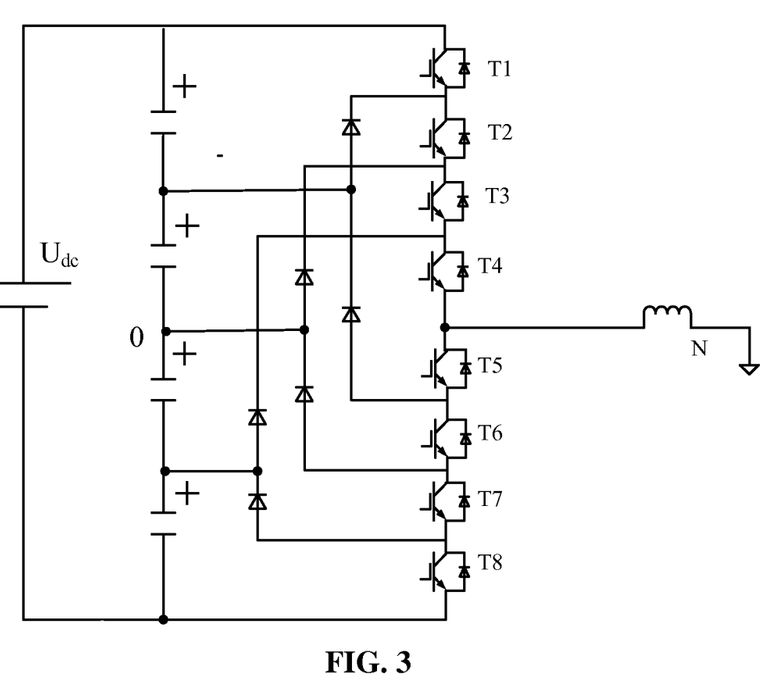
FIG. 3 is a view of a single-phase topology of a diode-clamped five-level inverter.

In addition, for a three-phase five-level inverter, a view of a single-phase topology of a diode-clamped five-level inverter according to an example is shown in FIG. 3. Since the topology is common knowledge in the art, its components and connections will not be described in detail herein by the present disclosure.

It can be seen from FIG. 3 that the single-phase five-level circuit includes 8 switches T1 to T8, therefore, the topology circuit of the three-phase five-level inverter includes 24 switches in total, and the outputted levels of the five-level inverter have five states: Level 2, Level 1, Level 0, Level −1, Level −2. In a case that the neutral point "o" on the direct current side is used as a reference point, the voltages of Level 2, Level 1, Level −1, and Level −2 are $U_{dc}/2$, $U_{dc}/4$, $-U_{dc}/4$ and $-U_{dc}/2$, respectively, where the correspondence between five outputted levels and states of switches is listed as follows.

TABLE 3

The five-level inverter's correspondence between states of switches and outputted levels

| outputted level | T1 | T2 | T3 | T4 | T5 | T6 | T7 | T8 |
|---|---|---|---|---|---|---|---|---|
| Level 2 | 1 | 1 | 1 | 1 | 0 | 0 | 0 | 0 |
| Level 1 | 0 | 1 | 1 | 1 | 1 | 0 | 0 | 0 |
| Level 0 | 0 | 0 | 1 | 1 | 1 | 1 | 0 | 0 |

TABLE 3-continued

The five-level inverter's correspondence between
states of switches and outputted levels

| outputted level | T1 | T2 | T3 | T4 | T5 | T6 | T7 | T8 |
|---|---|---|---|---|---|---|---|---|
| Level −1 | 0 | 0 | 0 | 1 | 1 | 1 | 1 | 0 |
| Level −2 | 0 | 0 | 0 | 0 | 1 | 1 | 1 | 1 |

It can be seen from Table 3 that, in a case that a PWM high frequency signal outputted by the inverter is between Level 2 and Level 1, only T1 and T5 operate at a high frequency and are high frequency complementary, whereas other switches maintain in an unchanged state. In a case that the PWM high frequency signal is between Level 1 and Level 0, only T2 and T6 operate at a high frequency and are high frequency complementary, whereas other switches maintain in an unchanged state. In a case that the PWM high frequency signal is between Level −1 and Level 0, only T3 and T7 operate at a high frequency and are high frequency complementary, whereas other switches maintain in an unchanged state. In a case that the PWM high frequency signal is between Level −2 and Level −1, only T4 and T8 operate at a high frequency and are high frequency complementary, whereas other switches maintain in an unchanged state. It can be seen that, in each of switching periods, there is only one pair of complementary switches outputting a PWM high frequency signal for each bridge arm of the five-level inverter regardless of the state of the arm, and other switches maintain in an unchanged state.

Based on the above analyses of switches in single-phase topologies of a three-level inverter, a four-level inverter and a five-level inverter, it can be seen that, in each of switching periods, there is only one pair of high frequency complementary switches outputting a PWM high frequency signal for each bridge arm of the inverter regardless of the state of the arm, and other switches maintain in an unchanged state, in addition, the states of the other switches are only switched once each power frequency period (It should be noted that, this characteristic of an inverter is applicable to all types of multi-level inverters, the present disclosure only uses the above three inverters as examples for analysis and illustration, and the types of inverters are not limited to the above three). Therefore, according to the characteristic of an inverter, the applicant provides a new method and a device of generating PWM pulses for a multi-level inverter for purpose of saving PWM peripheral resources of a DSP control unit in the multi-level inverter, and thereby reducing the difficulty in increasing the number of levels of the inverter.

Figure 4:
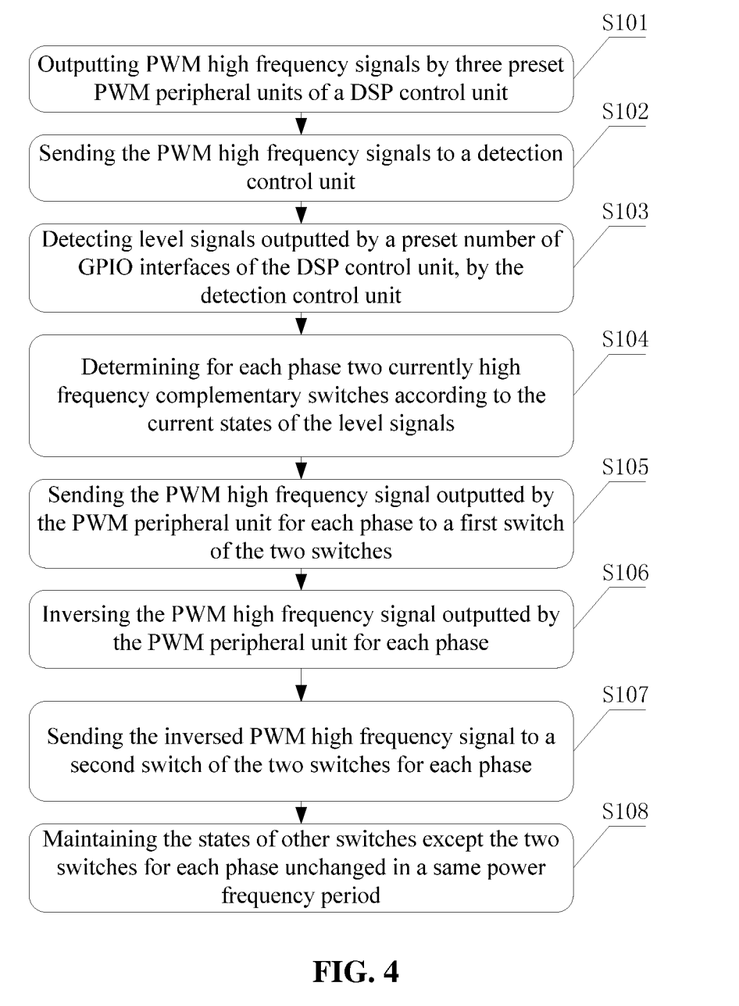
FIG. 4 is a schematic flow chart of a method for generating PWM pulses for a multi-level inverter according to an embodiment of the present disclosure.

Specifically, FIG. 4 illustrates a flow chart of a method of generating PWM pulses for a multi-level inverter according to an embodiment of the present disclosure. The method may be applied to a device of generating PWM pulses for an inverter, and the device may include a DSP control unit and a detection control unit connected thereto. The method and the device are applicable to generate PWM pulses for a multi-level inverter, such as a three-level inverter, a four-level inverter and a five-level inverter. The method may include the following steps S101 to S108.

In step S101, PWM high frequency signals are outputted by three preset PWM peripheral units of the DSP control unit.

The DSP control unit is a DSP chip inside the multi-level inverter, for which the function of a DSP chip of a multi-level inverter in a conventional method of generating PWM pulses for the multi-level inverter may be used as a reference. For example, a C2000 Series DSP chip of Texas Instruments can be used. Certainly, other types of DSP chips can be also used, as long as the DSP chip includes at least three PWM peripheral units and GPIO interfaces, which is not limited by the present disclosure.

The three preset PWM peripheral units according the embodiment are any three of the multiple PWM peripheral units of the DSP chip, and each of the three PWM peripheral units corresponds to output of each phase of the three-phase inverter respectively.

In step S102, the PWM high frequency signals are sent to the detection control unit.

In the present disclosure, the detection control unit is a CPLD (Complex Programmable Logic Device) or a FPGA (Field Programmable Gate Array).

In step S103, the detection control unit detects level signals outputted by a preset number of GPIO interfaces of the DSP control unit.

The preset number of the GPIO interfaces depends on the number of phases of the multi-level inverter and the number of layers of carrier modulation needed by the multi-level inverter.

Specifically, for a three-phase three-level inverter, two layers of carrier modulation are needed, therefore, a modulation signal corresponding to each phase can be divided into 2 intervals, and the 2 different intervals of the modulation signal can be distinguished from each other by only one GPIO interface, in this case, the DSP control unit only needs to determine the output states of the three GPIO interfaces according to a correspondence between the modulation wave and the carrier wave, and sends the states to the detection control unit via varied level. In other words, in a case that the inverter is a three-phase three-level inverter, the detection control unit detects current levels of the three predetermined GPIO interfaces of the DSP control unit.

Similarly, for a three-phase four-level inverter (or a three-phase five-level inverter), three (or four) layers of carrier modulation are needed, therefore, a modulation signal corresponding to each phase can be divided into three intervals (or four intervals), and the three (or four) different intervals of the modulation signal can be distinguished from each other by at least two GPIO interfaces, in this case, the DSP control unit sends the level signals of the six predetermined GPIO interfaces to the detection control unit.

In step S104, two currently high frequency complementary switches are determined for each phase, according to the current states of the level signals.

In the present disclosure, for the topology circuit of each phase of the inverter, after determining the current states of the level signals outputted by the GPIO interfaces corresponding thereto, a pair of high frequency complementary switches corresponding to the states can be determined according to the stored correspondence between states of level signals of GPIO interfaces and states of switches, for the convenience of subsequent description.

Specifically, the above single phases of a three-level inverter, a four-level inverter and a five-level inverter are still used as examples for illustration, the correspondences between current states (i.e., high level or low level) of level signals outputted by corresponding GPIO interfaces and states of switches are listed in the following Table 4 to Table 6. In practical applications of the present disclosure, the correspondences listed in the following Table 4 to Table 6 can be stored in advance in a memory within a device.

TABLE 4 correspondence between current states of GPIO interfaces and
states of switches for a single phase of a three-level inverter

| states of switches | level of GPIO |
|---|---|
| T1 and T3: high frequency complementary; T2: on-state; T4: off-state | high |
| T2 and T4: high frequency complementary; T3: on-state; T1: off-state | low |

TABLE 5 correspondence between current states of GPIO interfaces and
states of switches for a single phase of a four-level inverter

| states of switches | level of GPIO1 | level of GPIO2 |
|---|---|---|
| T1 and T4: high frequency complementary; T2: on-state; T3: on-state; T5: off-state; T6: off-state | high | high |
| T2 and T5: high frequency complementary; T3: on-state; T4: on-state; T6: off-state; T1 off-state | high | low |
| T3 and T6: high frequency complementary; T4: on-state; T5: on-state; T2: off-state; T1: off-state | low | high |

TABLE 6 correspondence between current states of GPIO interfaces and
states of switches for a single phase of a five-level inverter

| states of switches | level of GPIO1 | level of GPIO2 |
|---|---|---|
| T1 and T5: high frequency complementary; T2: on-state; T3: on-state; T4: on-state; T6: off-state; T7: off-state; T8: off-state | high | high |
| T2 and T6: high frequency complementary; T3: on-state; T4: on-state; T5: on-state; T1: off-state; T7: off-state; T8: off-state | high | low |
| T3 and T7: high frequency complementary; T4: on-state; T5: on-state; T6: on-state; T1: off-state; T2: off-state; T8: off-state | low | high |
| T4 and T8: high frequency complementary; T5: on-state; T6: on-state; T7: on-state; T1: off-state; T2: off-state; T3: off-state | low | low |

It can be seen from the above analyses and tables that each phase of a three-level inverter corresponds to one GPIO interface. Therefore, in practical applications, states of switches at a certain phase can be determined by determining the current state of the level signal outputted by a corresponding GPIO interface, according to the correspondence listed in the above Table 4. And each phase of a four-level inverter or a five-level inverter corresponds to two GPIO interfaces, therefore, in practical applications, states of switches at a certain phase can be determined by determining the current states of level signals outputted by two GPIO interfaces corresponding to the phase.

In step S105, the PWM high frequency signal outputted by the PWM peripheral unit is sent for each phase to a first switch of the determined two switches.

The first switch is any one of the determined two switches. For a three-phase multi-level inverter in the present disclosure, only three PWM peripheral units of the DSP control unit are used, and each of the three PWM peripheral units corresponds to each phase of the three-phase multi-level inverter respectively. Therefore, for any phase of the inverter, the above characteristic of the inverter (i.e., there is only one pair of high frequency complementary switches outputting a PWM high frequency signal for each bridge arm of the multi-level inverter regardless of the state of the arm, and other switches maintain in an unchanged state) can be utilized, and the detection control unit sends the PWM high frequency signal outputted by the PWM peripheral unit corresponding to each phase to any one of a pair of high frequency complementary switches corresponding to the current states, which greatly saves PWM peripheral resources and thereby reducing the difficulty in increasing the number of levels of the inverter.

In step S106, the PWM high frequency signal outputted by the PWM peripheral unit is inversed for each phase.

In step S107, the inversed PWM high frequency signal is sent to a second switch of the two switches for each phase.

It can be seen from the above description that, the second switch and the first switch are two different switches which are high frequency complementary in each switching period, and the PWM high frequency signal only needs to be sent to currently high frequency complementary switches according to the embodiment of the present disclosure. Therefore, if the PWM high frequency signal outputted by one PWM peripheral unit corresponding to each phase is sent to any one of one pair of high frequency complementary switches, the PWM high frequency signal will be inversed and then will be sent to the other one of the pair of switches.

In step S108, the states of other switches except the two switches for each phase are maintained unchanged in a same power frequency period.

The states of other switches except the two switches are determined according to a preset correspondence between level signals outputted by GPIO interfaces and states of switches for each phase, i.e., the preset correspondences listed in the above Table 4 to Table 6.

In addition, each power frequency period includes multiple switching periods, the states of the first switch and the second switch of the two switches are changed once for each of the switching period, whereas the states of the other switches except the two switches are only changed once for each power frequency period. Therefore, every time the two switches are changed, the object to which the PWM high frequency signal outputted by the PWM peripheral unit for each phase is sent will change from the first switch to the second switch. Specifically, after the step S107 in each power frequency period and after a switching period, the PWM high frequency signal outputted by the PWM peripheral unit for each phase is sent to the second switch, and the PWM high frequency signal is inversed and then sent to the first switch for each phase, and so forth until moving into the next power frequency period.

It can be seen from the above analyses that, there is one pair of high frequency complementary switches for a three-phase multi-level inverter in any state and other switches maintain in an unchanged state according to the embodiment of the present disclosure. The present disclosure only use three PWM peripheral units of a DSP control unit to output PWM high frequency signals, to output PWM high frequency signals for a three-phase multi-level inverter. Compared with the conventional art, the present disclosure greatly saves DSP peripheral resources configured to output PWM pulses for a three-phase multi-level inverter, enlarges the application range of the three-phase multi-level inverter and reduces the difficulty in increasing the number of levels of the three-phase inverter.

Figure 5:
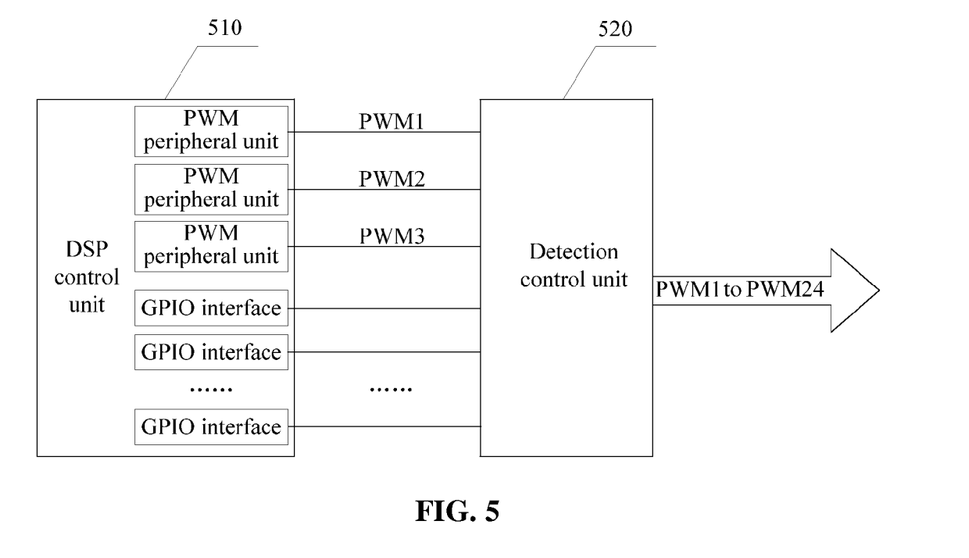
FIG. 5 is a schematic view of the structure of a device for generating PWM pulses for a multi-level inverter according to an embodiment of the present disclosure.

Reference is made to FIG. 5, which illustrates a schematic view of the structure of a device of generating PWM pulses for a multi-level inverter according to an embodiment of the present disclosure The device mainly includes a DSP control unit 510 and a detection control unit 520. The DSP control unit includes multiple PWM peripheral units (FIG. 5 only illustrates three PWM peripheral units) and multiple GPIO interfaces. The detection control unit is connected to the multiple GPIO interfaces.

Only three PWM peripheral units of the DSP control unit 510 are used to output PWM high frequency signals (i.e. PWM1 to PWM3 shown in FIG. 5), and the PWM high frequency signals are sent to the detection control unit.

The detection control unit 520 is configured to detect level signals outputted by a preset number of GPIO interfaces of the multiple GPIO interfaces, determines two currently high frequency complementary switches for each phase according to the states of the level signals, sends the PWM high frequency signal outputted by a corresponding PWM peripheral unit for each phase to a first switch (i.e., any one of the two switches), inverses the PWM high frequency signal and then sends it to a second switch (i.e., the other one of the two switches, which differs from the first switch) for each phase, and maintains the states of the other switches except the two switches unchanged for each phase in a power frequency period.

The states of the other switches are determined according to a preset correspondence between level signals outputted by GPIO interfaces and states of switches, which is stored for each phase.

In this embodiment, the number of level signals outputted by the GPIO interfaces, which are to be detected by the detection control unit 520, depends on the number of levels of the inverter. It can be seen from the analyses according to the above method embodiment that: in a case that the inverter is a three-level inverter, the detection control unit 520 needs to detect level signals outputted by three GPIO interfaces, and each of the GPIO interfaces corresponds to one of single-phase topology circuits of the inverter; in a case that the inverter is a four-level inverter or a five-level inverter, the detection control unit 520 needs to detect level signals outputted by six GPIO interfaces, and every two of the GPIO interfaces correspond to one of single-phase topology circuits of the inverter; in a case that the inverter has more levels, the number of intervals into which a modulation signal of each corresponding phase can be divided and the required number of GPIO interfaces configured to distinguish the intervals can be determined according to the analyses described in the above method embodiment, thereby determining the required number of GPIO interfaces to be used, which will not be described in detail herein by the present disclosure.

Preferably, the detection control unit 520 according to an embodiment of the present disclosure is a CPLD control unit or a FPGA control unit, its components and structure are common knowledge in the art, which will not be described in detail herein by the present disclosure.

In addition, on the basis of the above embodiments, the device of generating PWM pulses for a multi-level inverter further includes a display unit connected to the detection control unit, where the display unit is configured to display the waveforms of the PWM pulses for purpose of viewing by staff.

It should be noted that, for the above embodiments of the present disclosure, in addition to the units or devices described above, connection components configured to connect the units or devices can also be included, such as wires or communication buses, which will not be listed in detail herein by the present disclosure. Those determined by one skilled in the art without involving any creative efforts will fall within the scope of the present disclosure.

On the basis of the above analyses, in the practical applications of embodiments of the present disclosure, only three of the peripheral units of the DSP control unit of the device are used to output PWM high frequency signals, thereby realizing outputting PWM high frequency signals of the three-phase multi-level inverter. Compared with the conventional art, the present disclosure greatly saves DSP peripheral resources configured to output PWM pulses of a multi-level inverter, enlarges the application range of the three-phase multi-level inverter and reduces the difficulty in increasing the number of levels of the three-phase inverter.

The embodiments of the present disclosure are described in a progressive way, each of the embodiments places the emphasis upon aspects in which it differs from the other embodiments, and the embodiments refer to each other for the same or similar part of them. For the device provided by the embodiments, since it corresponds to the method provided by the embodiments, therefore the descriptions are relatively brief and the related part can refer to the descriptions of the method.

The above descriptions of the disclosed embodiments enable those skilled in the art to realize or utilize the present disclosure. Various changes to the embodiments will be apparent to those skilled in the art, general principles can be realized in other embodiments without departing from the spirit or scope of the present disclosure. Therefore, the present disclosure will fall into the widest scope which is consistent with the principles and novel features disclosed herein, rather than be limited to the embodiments described herein.

The invention claimed is:

1. A method for generating PWM pulses for a multi-level inverter, wherein the method is applied to a device for generating the PWM pulses for the inverter, wherein the device comprises a DSP control unit and a detection control unit connected to the DSP control unit, and wherein the method comprises:

outputting PWM high frequency signals by three PWM peripheral units of the DSP control unit;

sending the PWM high frequency signals to the detection control unit;

detecting level signals outputted by a preset number of GPIO interfaces of the DSP control unit, by the detection control unit;

determining, for each phase, two high frequency complementary switches of the inverter, according to state of the level signals;

sending, for each phase, the PWM high frequency signal outputted by one of the PWM peripheral units to a first switch of the two switches;

inversing, for each phase, the PWM high frequency signal outputted by the one of the PWM peripheral units;

sending, for each phase, the inversed PWM high frequency signal to a second switch of the two switches; and maintaining, for each phase, state of other switches of the inverter except the two switches unchanged in a power frequency period, wherein the state of the other switches are determined according to a correspondence stored for each phase between the level signals outputted by the GPIO interfaces and the states of the switches.

2. The method according to claim 1, wherein in a case that the inverter is a three-phase three-level inverter, the preset number is three, and the three GPIO interfaces corresponds to the three phases of the inverter respectively, wherein, determining, for each phase, two high frequency complementary switches of the inverter according to state of the level signals comprises:

determining, for each phase, two high frequency complementary switches, according to the state of the level signal outputted by each of the GPIO interfaces.

3. The method according to claim 1, wherein in a case that the inverter is a three-phase four-level inverter or a three-phase five-level inverter, the preset number is six,
wherein, determining, for each phase, two high frequency complementary switches of the inverter according to state of the level signals comprises:
determining, for each phase, two high frequency complementary switches, according to the state of the level signals outputted by every two of the GPIO interfaces, wherein each phase of the inverter corresponds to every two of the GPIO interfaces.

4. The method according to claim 1, wherein the state of the level signals outputted by the GPIO interfaces are determined according to a correspondence between PWM high frequency signals and a triangular carrier signal.

5. The method according to claim 4, wherein the power frequency period comprises multiple switching periods, and the state of the two switches are changed once for each of the switching periods,
wherein, after sending the inversed PWM high frequency signal to a second switch of the two switches, the method further comprises:
sending, for each phase, the PWM high frequency signal outputted by the one of the PWM peripheral units to a second switch of the two switches after one of the switching periods; and
sending, for each phase, the inversed PWM high frequency signal to the first switch of the two switches.

6. A device for generating PWM pulses for a multi-level inverter, wherein the device comprises:
a DSP control unit and a detection control unit, wherein the DSP control unit comprises multiple PWM peripheral units and multiple GPIO interfaces, and the detection control unit is connected to the multiple GPIO interfaces, and wherein
only three of the multiple PWM peripheral units of the DSP control unit are used to output PWM high frequency signals which are sent to the detection control unit;
the detection control unit detects level signals outputted by a preset number of GPIO interfaces of the multiple GPIO interfaces, determines, for each phase, two high frequency complementary switches of the inverter according to state of the level signals, sends, for each phase, the PWM high frequency signal outputted by one of the PWM peripheral units to a first switch of the two switches, inverses, for each phase, the PWM high frequency signal and then sends, for each phase, it to a second switch of the two switches, and maintains, for each phase, state of other switches of the inverter except the two switches unchanged in a power frequency period; and
the state of the other switches are determined according to a correspondence stored for each phase between the level signals outputted by the GPIO interfaces and the states of the switches.

7. The device according to claim 6, wherein the detection control unit is a CPLD control unit.

8. The device according to claim 6, wherein the detection control unit is a FPGA control unit.

9. The device according to claim 6, wherein in a case that the inverter is a three-phase three-level inverter, the preset number is three, and the three GPIO interfaces corresponds to the three phases of the inverter respectively.

10. The device according to claim 6, wherein in a case that the inverter is a three-phase four-level inverter or a three-phase five-level inverter, the preset number is six, and each of the three phases of the inverter corresponds to every two of the GPIO interfaces.

* * * * *